United States Patent
Chuang et al.

(10) Patent No.: US 11,610,901 B2
(45) Date of Patent: *Mar. 21, 2023

(54) SEMICONDUCTOR DEVICE HAVING A BUTTED CONTACT, METHOD OF FORMING AND METHOD OF USING

(71) Applicant: TAIWAN SEMICONDUCTOR MANUFACTURING COMPANY, LTD., Hsinchu (TW)

(72) Inventors: You Che Chuang, Hsinchu (TW); Chih-Ming Lee, Hsinchu (TW); Hsin-Chi Chen, Hsinchu (TW); Hsun-Ying Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/111,074

(22) Filed: Dec. 3, 2020

(65) Prior Publication Data

US 2021/0091091 A1 Mar. 25, 2021

Related U.S. Application Data

(63) Continuation of application No. 16/395,703, filed on Apr. 26, 2019, now Pat. No. 10,861,859.

(60) Provisional application No. 62/691,893, filed on Jun. 29, 2018.

(51) Int. Cl.
*H01L 27/11* (2006.01)
*G11C 5/06* (2006.01)

(52) U.S. Cl.
CPC ............ *H01L 27/1104* (2013.01); *G11C 5/06* (2013.01)

(58) Field of Classification Search
None
See application file for complete search history.

(56) References Cited

U.S. PATENT DOCUMENTS

| | | | |
|---|---|---|---|
| 10,861,859 B2 * | 12/2020 | Chuang | H01L 27/0207 |
| 2011/0235407 A1 | 9/2011 | Lim | |
| 2012/0187504 A1 * | 7/2012 | Igarashi | H01L 21/76895 |
| | | | 257/390 |
| 2015/0009750 A1 * | 1/2015 | Schaefer | H01L 27/11 |
| | | | 365/156 |
| 2016/0111430 A1 * | 4/2016 | Liaw | H01L 27/1104 |
| | | | 438/283 |

* cited by examiner

*Primary Examiner* — Hsien Ming Lee
(74) *Attorney, Agent, or Firm* — Hauptman Ham, LLP

(57) ABSTRACT

A semiconductor structure includes a first transistor comprising a first gate structure over a first active region in a substrate. The semiconductor structure further includes a second active region in the substrate. The semiconductor structure further includes a first butted contact. The butted contact includes a first portion extending in a first direction and overlapping the second active region, and a second portion extending from the first portion in a second direction, different from the first direction, wherein the second portion directly contacts the first gate structure.

20 Claims, 12 Drawing Sheets

SEMICONDUCTOR DEVICE HAVING A BUTTED CONTACT, METHOD OF FORMING AND METHOD OF USING

PRIORITY CLAIM

The present application is a continuation of U.S. application Ser. No. 16/395,703, filed Apr. 26, 2018, which claims the priority of U.S. Provisional Application No. 62/691,893, filed Jun. 29, 2018, which are incorporated herein by reference their entireties.

BACKGROUND

Butted contacts are widely used for connecting semiconductor devices. Occupying less layout area, butted contacts are particularly suitable for laying out integrated circuits having high density such as static random access memory (SRAM) cells.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1:
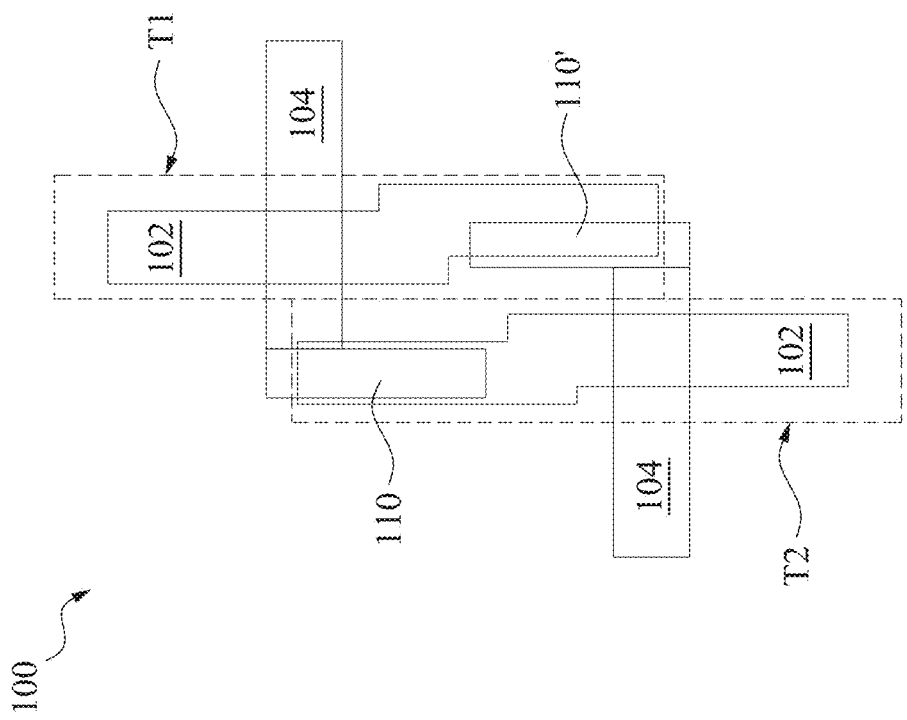
FIG. 1 is a layout of a cross-coupling arrangement of semiconductor devices using rectangular-shaped butted contacts, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIG. 1 is a layout of a cross-coupling arrangement of a semiconductor device 100 using rectangular-shaped butted contacts 110, 110'. Butted contacts 110, 110' provide electrical connection between a first transistor T1 and a second transistor T2. Each of first and second transistors T1 and T2 includes an active region 102 and a gate structure 104 that extends over active region 102. Butted contact 110 electrically couples gate structure 104 of first transistor T1 to active region 102 of second transistor T2 Likewise, butted contact 110' electrically couples active region 102 of first transistor T1 to gate structure 104 of second transistor T2. A butted contact is generally usable for coupling of a terminal of a first transistor and a terminal of a second transistor, wherein a terminal comprises a source feature, a drain feature, a gate structure, or any combination thereof.

Butted contacts 110, 110' are formed to have an elongated, substantially rectangular shape with one end resting on an active region of one transistor and the other end resting on a neighboring gate structure of another transistor. The rectangular-shaped butted contact suffers drawbacks. As the transistor dimensions shrink, it is increasingly difficult to maintain precise overlay tolerance. Therefore, even small misalignments of the masks in the formation of the contact opening within which the butted contact forms will result in disconnection of the butted contact and the target gate structure. For example, as illustrated in FIG. 1, in the case of misalignment, butted contact 110 and gate structure 104 of first transistor T1 are not in contact with each other due to the relatively small overlay area between them. The misalignment of the butted contact causes substantial device yield loss and also reduces device reliability.

Accordingly, the present disclosure relates to a butted contact design with increased overlay tolerance. The butted contact of the present disclosure includes a substantially rectangular-shaped first portion overlapping an active region of one transistor, and a second portion intersecting the first portion and overlapping a neighboring gate structure of another transistor. The inclusion of the second portion helps to ensure sufficient contact between the butted contact and the target gate structure, thereby increasing overlay tolerance. As a result, the yield loss due to misalignment of butted contact is reduced.

Figure 2:
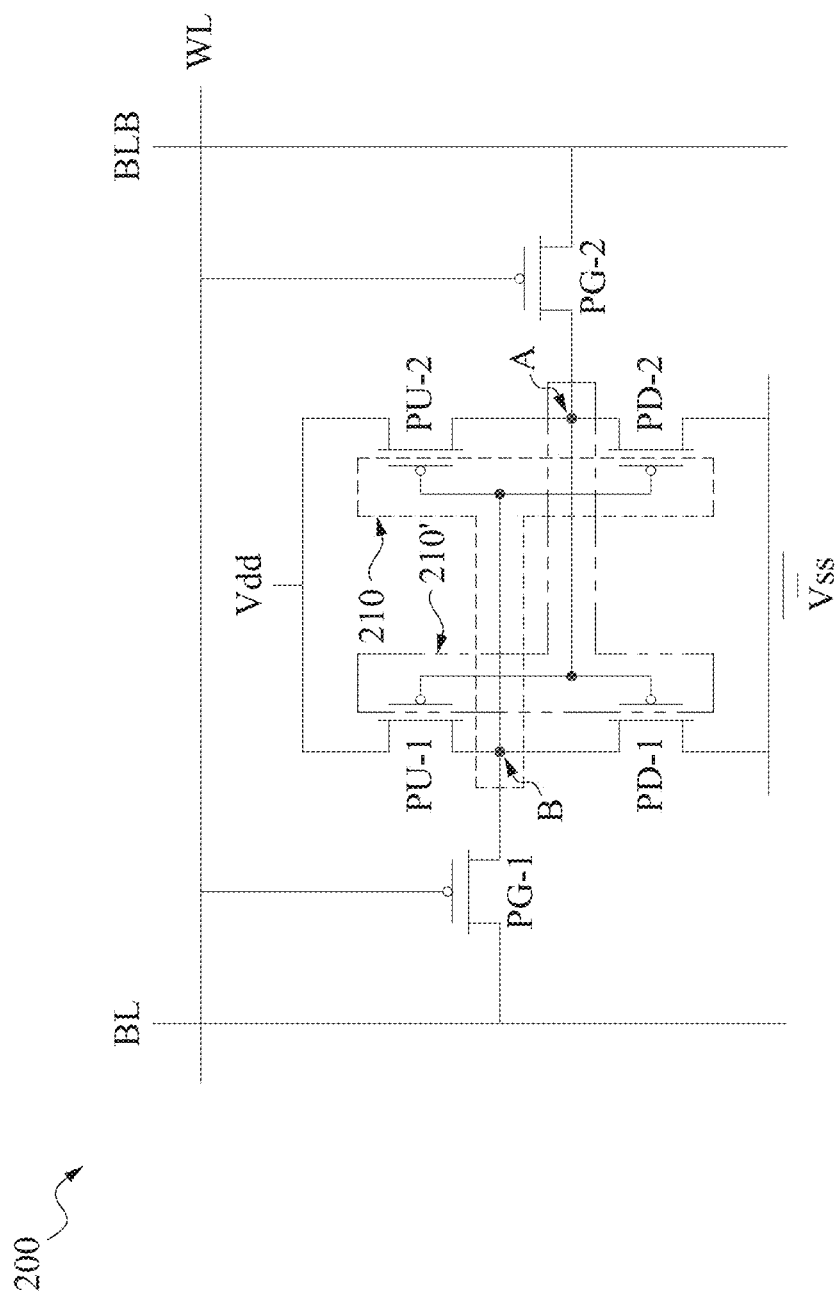
FIG. 2 is a circuit diagram of a static random access memory (SRAM) cell, in accordance with some embodiments.

FIG. 2 is a circuit diagram of an SRAM cell 200, in accordance with some embodiments. SRAM cell 200 is a six transistor (6T) cell used for illustration. In some embodiments, SRAM cell 200 employs a number of transistors other than six. Other types of memory cells are also within the scope of various embodiments. SRAM cell 200 includes two crossed-coupled invertors. The first invertor includes a first pull-up transistor (PU-1) and a first pull-down transistor (PD-1), while the second invertor includes a second pull-up transistor (PU-2) and a second pull-down transistor (PD-2). SRAM cell 200 also includes two pass-gate transistors PG-1 and PG-2 to control reading from and writing into SRAM cell 200. In some embodiments, pull-up transistors PU-1 and PU-2 are p-type metal-oxide-semiconductor (PMOS) transistors, while pass-gate and pull-down transistors PG-1, PG-2, PD-1 and PD-2 are n-type metal-oxide-semiconductor (NMOS) transistors. The gates of pass-gate transistors PG-1 and PG-2 are connected, and controlled by, word-line WL that determines whether SRAM cell 200 is selected or not. The sources of pull-up transistors PU-1 and PU-2 are connected to a positive power supply voltage/node Vdd. The sources of pull-down transistors PD-1 and PD-2 are connected to a power-supply voltage/node Vss, which is an electrically ground. The gates of transistors PU-1 and PD-1 are connected to the drains of transistors PU-2 and PD-2 at a first storage node A. The gates of transistors PU-2 and PD-2 are connected to the drains of transistors PU-1 and PD-1 at a second storage node B. The source of pass-gate transistor PG-1 is connected to Bit-line BL, and the drain of pass-gate transistor PG-1 is connected to the second storage node B. The source of pass-gate transistor PG-2 is connected to Bit-line BLB, and the drain of pass-gate transistor PG-2 is connect to the first storage node A. Butted contacts are used to form electrical connections between the cross-coupled invertors, shown here as a connection 210 between the drain of transistor PU-1 and the gate of transistors PU-2 and PD-2, and a connection 210' between the drain of transistor PU-2 and the gate of transistors PU-1 and PD-1. During operation, data is written into SRAM cell 200 by first activating the word-line WL coupled to pass-gate transistors PG-1 and PG-2. Subsequently, the digital bit carried on the bit-line BL is passed to the second storage node B, and the complementary bit carried on the bit-line BLB is passed to the first storage node A. This state is held until new data is applied on pass-gate transistors PG-1 and PG-2.

Figure 3:
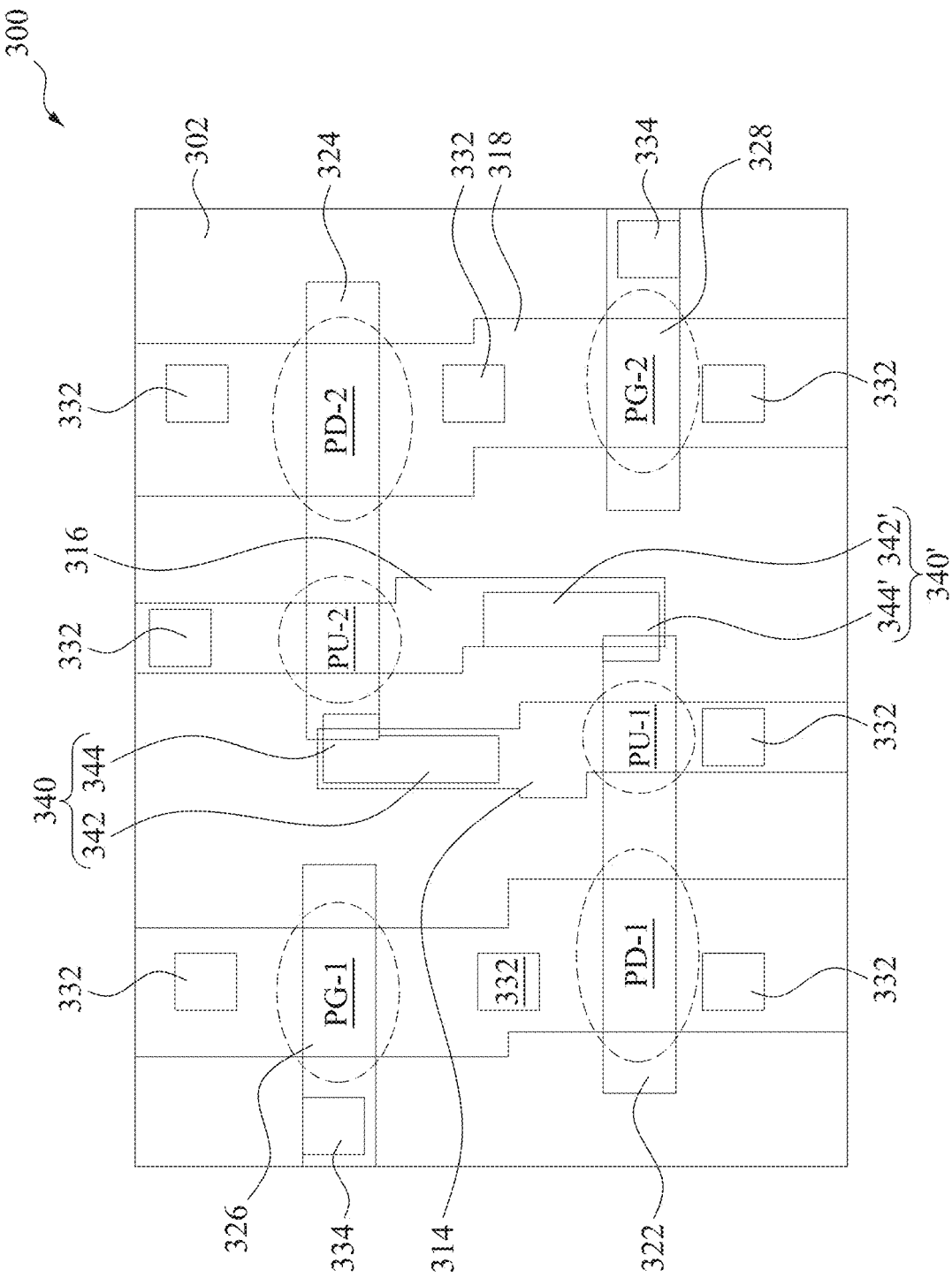
FIG. 3 is a layout of an SRAM cell, in accordance with some embodiments.

FIG. 3 is a layout of an SRAM cell (i.e., SRAM cell layout) 300, in accordance with some embodiments. SRAM cell layout 300 includes a plurality of active regions 312, 314, 316 and 318 and a plurality of gate structures 322, 324, 326 and 328 from which various transistors including a first pull-up transistor PU-1 and a first pull-down transistor PD-1 for constructing a first invertor, a second pull-up transistor PU-2 and a second pull-down transistor PD-2 for constructing a second invertor, and first and second pass-gate transistors PG-1, PG-2 are produced.

Gate structure 322 is disposed extending across active regions 312 and 314, forming first pull-down transistor PD-1 with the underlying active region 312, and first pull-up transistor PU-1 with the underlying active region 314. Gate structure 324 is disposed extending across active regions 316 and 318, forming second pull-up transistor PU-2 with the underlying active region 316 and second pull-down transistor PD-2 with the underlying active region 318. Gate structure 326 is disposed on active region 312, forming first pass-gate transistor PG-1 with the underlying active region 312. Gate structure 328 is disposed on active region 318, forming second pass-gate transistor PG-2 with the underlying active region 318. Transistors PG-1 and PD-1 are thus formed in the same active region, i.e., active region 312, and transistors PG-2 and PD-2 are formed in the same active region, i.e., active region 318. Transistors PD-1 and PU-1 in the first invertor share a common gate (i.e., gate structure 322), and transistors PD-2 and PU-2 in the second invertor share a common gate (i.e., gate structure 324). In some embodiments, one or more of pass-gate transistors PG-1, PG-2, pull-up transistors PU-1 and PU-2, and pull-down transistors PD-1 and PD-2 are planar field effect transistors (FETs) having active regions 312 through 318 disposed in an upper portion of a semiconductor substrate. In some embodiments, one or more of pass-gate transistors PG-1 and PG-2, pull-up transistors PU-1 and PU-2, and pull-down transistors PD-1 and PD-2 are fin field-effect transistors (FinFETs) where active regions 312 through 318 include one or more fin structures.

Various contact structures are utilized to couple transistors PU-1, PU-2, PD-1, PD-2, PG-1 and PG2 to form a functional SRAM cell. Contact structures contacting active regions (i.e., source and drain features of transistors) are referred to as active area contacts. Contact structures contacting gate structures are referred to as gate contacts. In some embodiments, SRAM cell layout 300 includes a plurality of active area contacts 332 disposed on the respective active regions 312, 314, 316 and 318 and a plurality of gate contacts 334 landing on the respective gate structures 326 and 328. In some embodiments, active area contacts 332 and gate contacts 334 are rectangular shaped. In some embodiments, active area contacts 332 and gate contacts 334 are square shaped. In some embodiments, each of active area contacts 332 and gate contacts 334 has a minimum design rule size.

SRAM cell layout 300 also include a plurality of butted contacts 340, 340' which form cross-coupling connections between respective active regions 314, 316 and gate structures 322, 324 of transistors PU-1, PD-1, PU-2 and PD-2. In some embodiments, first butted contact 340 couples active region 314 of transistor PU-1 to gate structure 324 of transistors PU-2 and PD2, while second butted contact 340' couples active region 316 of transistor PU-2 to gate structure 322 of transistors PU-1 and PD-1.

First butted contact 340 includes a first portion 342 extending along a first direction and a second portion 344 extending along a second direction different from the first direction and intersecting first portion 342. In some embodiments, first portion 342 extends along active region 314 and second portion 344 extends onto gate structure 324. In some embodiments, first portion 342 has a substantially rectangular-shape. Other shapes are contemplated as long as direct contact between first portion 342 and active region 314 is maintained. In some embodiments, first butted contact 340 is L-shaped having second portion 344 substantially perpendicular to first portion 342. In some embodiments, first portion 342 and second portion 344 are not perpendicular with each other, i.e., first portion 342 intersects second portion 344 at an angle greater than 90 degrees or less than 90 degrees.

Similarly, second butted contact 340' includes a first portion 342' extending along the first direction and a second portion 344' extending along the second direction and intersecting first portion 342'. In some embodiments, first portion 342' extends along active region 316 and second portion 344' extends onto gate structure 322. In some embodiments, first portion 342' has a substantially rectangular-shape. Other shapes are contemplated as long as direct contact between first portion 342' and active region 316 is maintained. In some embodiments, second butted contact 340' is L-shaped having second portion 344' substantially perpendicular to first portion 342'. In some embodiments, first portion 342' and second portion 344' are not perpendicular with each other, i.e., first portion 342' intersects second portion 344' at an angle greater than 90 degrees or less than 90 degrees.

In some embodiments, first portion 342 of first butted contact 340 overlaps, and is electrically connected to, at least active region 314 of transistor PU-1, while second portion 344 of first butted contact 340 overlaps, and is electrically connected to, at least gate structure 324 of transistors PU-2 and PD-2. In some embodiments, first portion 342 of first butted contact 340 solely contacts active region 314, and second portion 344 of first butted contact 340 contacts both active region 314 and gate structure 324. Similarly, first portion 342' of second butted contact 340' overlaps, and is electrically connected to, at least active region 316 of transistor PU-2, while second portion 344' of second butted contact 340' overlaps, and is electrically connected to, at least gate structure 322 of transistors PU-1 and PU-2. In some embodiments, first portion 342' of second butted contact 340' contacts solely active region 316, and second portion 344' of second butted contact 340' contacts both active region 316 and gate structure 322. In some embodiments, the length of second portion 344/344' of each of butted contacts 340, 340' is configured such that each of butted contacts 340, 340' overlaps about 10% to about 30% of a surface area of a top surface of a corresponding gate structure 322, 324. If the overlap is too small, the risk of disconnection between butted contact and target gate structure remains, in some instances. If the overlap is too large, the effect on preventing misalignment of butted contact does not change but cost increases, in some instances. In some embodiments, the distance between first portion 342/342' of each of butted contacts 340, 340' and a corresponding active area contact 332 on the same active region (i.e., active region 314 or 316) is from about 100 nm to about 150 nm. If the distance is too large, the risk of misalignment of butted contact on active region increases, in some instances. If the distance is too small, the risk of butted contact contacting both active area and gate structure of a same transistor increases.

The second portion of the butted contact of the present disclosure extends onto the target gate structure to ensure sufficient contact between the butted contact and the target gate structure in case of misalignment of butted contact. The inclusion of second portion to the rectangular-shaped butted contact helps to improve a landing window of the butted contact, which helps to reduce yield loss resulting from misalignment of the butted contact.

Table 1 provides test results for an SRAM cell using L-shaped butted contacts in comparison with an SRAM cell using conventional rectangular-shaped butted contacts. As shown in Table 1, when using an L-shaped butted contact to increase overlap between the butted contact and the targeted gate structure by about 20%, the yield of a 6T SRAM cell is increased by about 17%.

TABLE 1

| | SRAM with L-shaped butted contacts/SRAM with rectangular-shaped butted contacts |
|---|---|
| Increase of yield | 17% |
| Increase of overlap between butted contact and gate structure | 20% |

FIGS. 4A-7B are views of an SRAM cell 400 at various stages of fabrication. SRAM cell 400 is manufactured based on SRAM cell layout 300 of FIG. 3 using a CMOS (complementary metal oxide silicon) process. Like items in FIGS. 3-7B are indicated by like reference numerals, and for brevity, descriptions of the structure, provided with reference to previous figures will generally not be repeated in connection with subsequent figures.

Figure 4A:
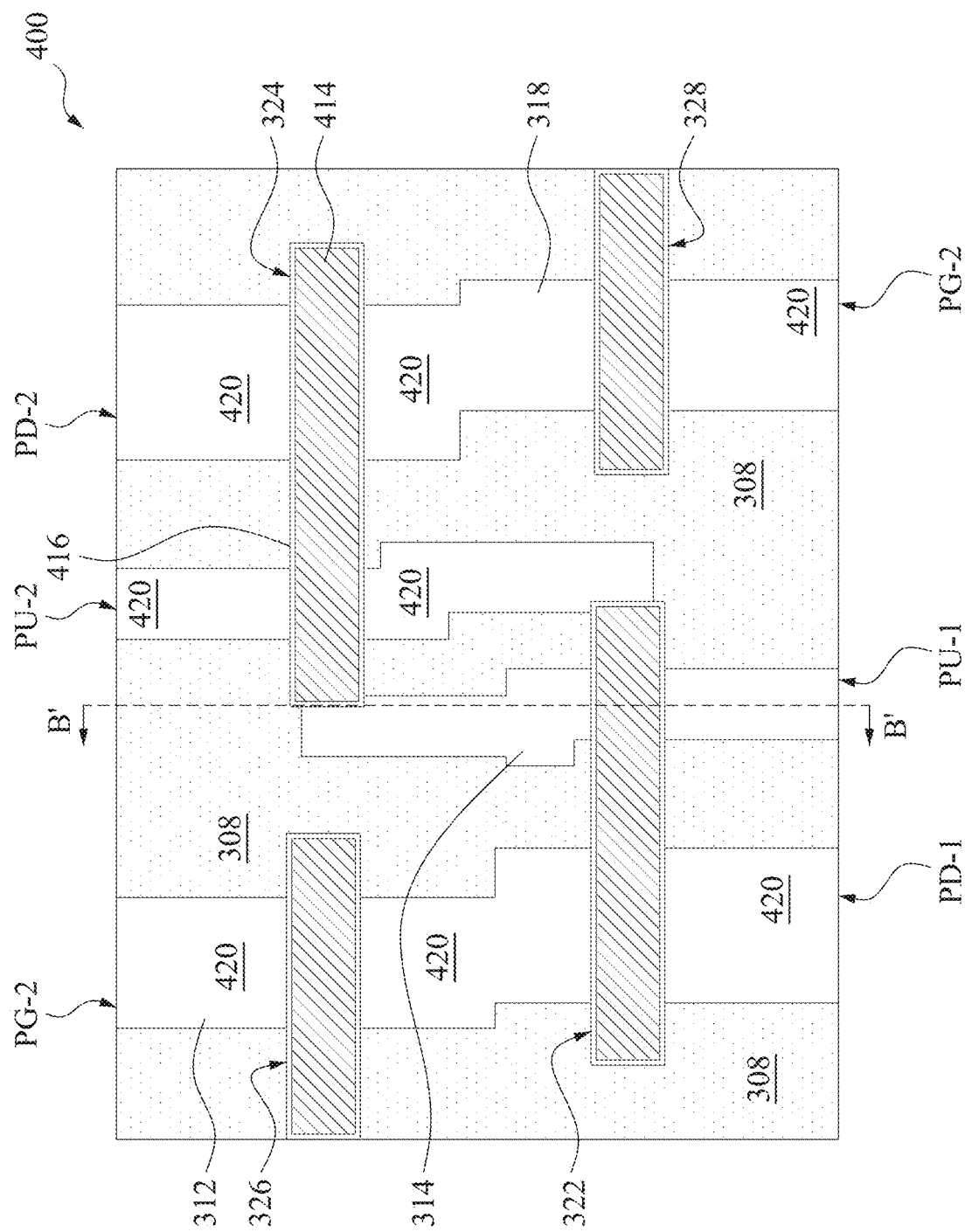
FIG. 4A is a top view of a semiconductor structure following formation of various transistors of an SRAM cell in a substrate, in accordance with some embodiments.
Figure 4B:
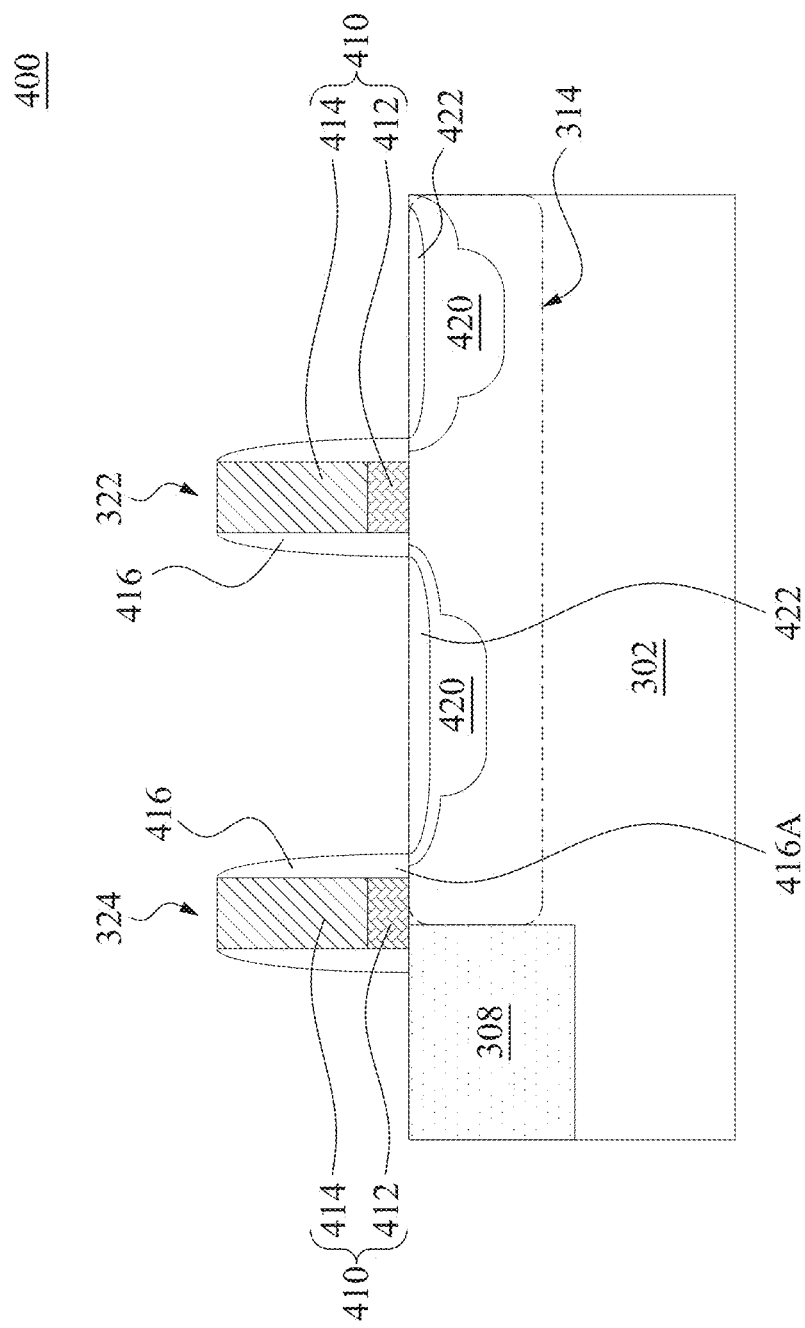
FIG. 4B is a cross-sectional view of the semiconductor structure of FIG. 4A taken along line B-B'.

FIG. 4A is a top view of a semiconductor structure following forming of various transistors of SRAM cell 400, in accordance with some embodiments. FIG. 4B is a cross-sectional view of the semiconductor structure of FIG. 4A taken along line B-B'.

Referring to FIGS. 4A and 4B, a substrate 302 is provided. In some embodiments, substrate 302 is a bulk semiconductor substrate including one or more semiconductor materials. Examples of suitable materials for substrate 302 include, but are not limited to, elementary semiconductor materials, compound semiconductor materials, and/or alloy semiconductor materials. Examples of elementary semiconductor materials include, but are not limited to, monocrystalline silicon (Si), polycrystalline silicon (poly-Si), amorphous silicon (a-Si), germanium (Ge), and/or diamond (C). Examples of binary compound semiconductor materials include, but are not limited to, IV-IV materials including silicon germanium (SiGe), germanium carbide (GeC), and silicon carbide (SiC), and III-V materials including gallium arsenide (GaAs), gallium phosphide (GaP), indium phosphide (InP), indium arsenide (InAs), and/or indium antimonide (InSb). Examples of tertiary and quaternary compound semiconductor materials include, but are not limited to, GaAsP, AlInAs, AlGaAs, GaInAs, GaInP, and/or GaInAsP.

In some embodiments, the semiconductor layer(s) incorporated in substrate 302 are formed using a suitable technique or method including, but not limited to, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), atomic layer deposition (ALD), and/or combinations thereof.

In some embodiments, substrate 302 includes both a semiconductor material and an insulating material to form a semiconductor-on-insulator (SOI) substrate. In some embodiments, SOI substrate includes one or more semiconductor layers formed on an insulating material such as silicon dioxide or sapphire (silicon-on-sapphire (SOS)). In some embodiments, substrate 302 includes one or more epitaxial layer (epi-layer) and/or a strained layer resulting from an atomic and/or lattice mismatch.

In some embodiments, substrate 302 includes various doped regions. In some embodiments, substrate 302 are doped with p-type dopants, n-type dopants, or combinations thereof. The term "p-type" refers to the addition of impurities to an intrinsic semiconductor that creates deficiencies of valence electrons. Examples of p-type dopants, i.e., impurities, include, but are not limited to, boron, boron difluoride, gallium, and indium. "N-type" refers to the addition of impurities that contributes free electrons to an intrinsic semiconductor. Examples of n-type dopants, i.e., impurities, include, but are not limited to, antimony, arsenic, and phosphorous. In some embodiments, one or more dopant(s) are introduced into substrate 302 during formation of substrate 302, in the case of a single-layer substrate, or during formation of one or more layers comprising a multi-layer substrate.

Isolation structures 308 are formed in substrate 302 to define various active regions, including active regions 312 and 318 corresponding to NMOS transistors PG-1, PG-2, PD-1 and PD-2, and active regions 314 and 316 corresponding to PMOS transistors PU-1 and PU-2. In some embodiments, active regions 312, 314, 316 and 318 are intrinsic (i.e., un-doped) semiconductor regions. In some embodiments, active regions 312 and 318 where NMOS transistors are subsequently formed are doped with p-type dopants, and active regions 312 and 318 where PMOS transistors are subsequently formed are doped with n-type dopants. In some embodiments, active regions 312, 314, 316 and 318 are planar regions formed in an upper portion of substrate 302 for formation of planar FETs. In some embodiments, active regions 312, 314, 316 and 318 are semiconductor fins (not shown) that are raised from substrate 302 for formation of FinFETs. In some embodiments, the semiconductor fins are formed by lithography and etching. In some embodiments, a photoresist layer (not shown) is applied on substrate 302 and patterned to provide a patterned photoresist layer atop substrate 302. The pattern in the patterned photoresist layer is then transferred into substrate 302 by an anisotropic etch to provide semiconductor fins. In some embodiments, the etching process used for pattern transfer includes a dry etch such as, for example, reactive ion etch (RIE), plasma etch, ion beam etch or laser ablation. After transferring the pattern into substrate 302, the patterned photoresist layer is removed utilizing a resist stripping process such as, for example, ashing. In some embodiments, other methods such as sidewall image transfer (SIT) or directional self-assembly (DSA) are used to form semiconductor fins.

In some embodiments, isolation structures 308 are shallow trench isolation (STI) structures. Formation of isolation structures 308 includes etching trenches (not shown) in substrate 302 and filling trenches with one or more insulator materials such as silicon dioxide, silicon nitride, or silicon oxynitride. In some embodiments, one or more isolation structures 308 have a multi-layer structure including a thermal oxide liner and silicon nitride filling the trench. In some embodiments, trenches are formed by applying a photoresist layer (not shown) over substrate 302, lithographically patterning the photoresist layer, and transferring the pattern in the photoresist layer into an upper portion of substrate 302 using an anisotropic etch such as RIE or plasma etch. Insulator materials are deposited by chemical vapor deposition (CVD), physical vapor deposition (PVD), or atomic layer deposition (ALD). A chemical mechanical planarization (CMP) process is performed to polish back excessive insulator materials and planarize top surfaces of isolation structures 308. In some embodiments, isolation structures 308 are formed by oxidizing or nitriding portions of substrate 302. In instances where active regions 312, 314 316 and 318 are semiconductor fins, isolation structures 308 surround bottom portions of semiconductor fins.

Gate structures 322, 324, 326 and 328 are formed over substrate 302. A first gate structure 322 is disposed to extend across active region 312 and 314. A second gate structure 324 is disposed to extend across active regions 316 and 318. A third gate structure 326 is disposed on active region 312. A fourth gate structure 328 is disposed over active region 318. Each of gate structures 322, 324, 326 and 328 includes a gate stack 410 and gate spacers 416 on sidewalls of gate stack 410. In some embodiments, gate stack 410 includes a gate dielectric 412 over substrate 302, and a gate electrode 414 over gate dielectric 412. Gate dielectric 412 is optional and is omitted in some embodiments.

In some embodiments, gate stacks 410 are formed by providing a gate material stack (not shown) including an optional gate dielectric layer and a gate electrode layer over substrate 302, and lithographically patterning the gate material stack.

In some embodiments, the gate dielectric layer, if present, includes at least one interfacial dielectric layer and/or at least one high dielectric constant (high-k) dielectric layer. In some embodiments, the interfacial dielectric layer includes silicon dioxide, silicon nitride, silicon oxynitride, other suitable gate dielectric materials, or combinations thereof. The high-k dielectric layer includes a dielectric material having a dielectric constant greater than silicon dioxide. The high-k dielectric layer has a thickness that is greater than the interfacial dielectric layer. In some embodiments, the high-k dielectric layer includes hafnium oxide ($HfO_x$), lanthanum monoxide (LaO), aluminum monoxide (AlO), aluminum oxide ($Al_2O_3$), zirconium monoxide (ZrO), titanium monoxide (TiO), tantalum pentoxide ($Ta_2O_5$), strontium titanate ($SrTiO_3$), barium titanate ($BaTiO_3$), hafnium silicate (HfSiO), lanthanum silicate (LaSiO), aluminum silicate (AlSiO), hafnium titanate ($HfTiO_4$), or combinations thereof. In some embodiments, the gate dielectric layer is formed by CVD, ALD, thermal oxidation, ozone oxidation, or other suitable deposition techniques.

The gate electrode layer includes any suitable conductive material including, for example, doped polysilicon, an element metal such as tungsten (W), titanium (Ti), molybdenum (Mo), aluminum (Al), ruthenium (Ru) and copper (Cu), an alloy of at least two elemental metals, or a metal nitride such as tungsten nitride (WN), titanium nitride (Tin) and tantalum nitride (TaN). The gate electrode layer is formed by CVD, PVD, ALD or other suitable deposition techniques.

In some embodiments, the lithographic patterning of gate material stack is performed by an anisotropic etch, which is a dry etch such as, for example, RIE or a wet etch. Each remaining portion of the gate dielectric layer constitutes a gate dielectric 412, and each remaining portion of the gate electrode layer constitutes a gate electrode 414.

In some embodiments, dummy gate stacks (not shown) are formed first and then replaced later by gate stacks 410 after high thermal temperature processes, such as thermal processes for formation of source/drain features, are performed. In some embodiments, dummy gate stack includes a dummy gate dielectric (e.g., silicon dioxide) and a polysilicon dummy gate electrode and is formed by deposition and lithographic patterning processes described above.

After formation of gate stacks 410, gate spacers 416 are formed on sidewalls of gate stacks 410. In some embodiments, each of gate spacers 416 includes a dielectric material such as a dielectric oxide, a dielectric nitride, a dielectric oxynitride, or combinations thereof. In one embodiment, each of gate spacers 416 includes silicon nitride. In some embodiments, gate spacers 416 are formed by deposition a gate spacer material layer (not shown) on exposed surfaces of gate stacks 410 and substrate 302 and etching gate spacer material layer to remove horizontal portions of gate spacer material layer. In some embodiments, the gate spacer material layer is provided by a suitable deposition process including, for example, CVD, PECVD or ALD. The etching of the gate spacer material layer is performed by a dry etch such as, for example, RIE. Remaining vertical portions of the gate spacer material layer constitute gate spacers 416.

Source/drain features 420 are formed on portions of active regions 312, 314, 316 and 318 that are not covered by gate structures 322, 324, 326 and 328. Here, a source/drain feature 420 functions as either a source or a drain depending on the wiring of transistors. In some embodiments, source/drain features 420 independently include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials.

In some embodiments, source/drain features 420 are formed by implanting dopants of appropriate conductivity types into active regions 312, 314, 316 and 318 that are not covered by gate structures 322, 324, 326 and 328. For NMOS transistors (e.g., transistors PG-1, PG-2, PD-1 and PD-2), n-type dopants such as phosphorus or arsenic are implanted into active regions 312 and 318 using portions of gate structures 322, 324, 326 and 328 in active regions 312 and 318 as a mask. Active regions 314 and 316 for PMOS transistors are covered by a mask during the implantation process for n-type dopants. For PMOS transistors (e.g., transistors PU-1 and PU-2, p-type dopants such as boron are implanted into active regions 314 and 316 using portions of gate structures 322 and 324 in active regions 314 and 316 as a mask. Active regions 312 and 318 for PNMOS transistors are covered by a mask during the implantation process for p-type dopants.

In some embodiments, source/drain features 420 are epitaxial source/drain features (not shown) configured to apply stress to channel regions under gate stacks 410. Materials for epitaxial source/drain features of a PMOS transistor (e.g., transistors PU-1 and PU-2) are selected to apply a compressive force to the channel region to improve mobility of holes. For example, when substrate 302 is a silicon substrate, the epitaxial source/drain features are formed of silicon-germanium and/or germanium. Materials for epitaxial source/drain features of a NMOS transistor (e.g., transistors PG-1, PG-2, PD-1 and PD-2) are selected to apply a tensile force to the channel region to improve mobility of electrons. For example, when substrate 302 is a silicon substrate, the epitaxial source/drain features are formed of silicon carbon. In some embodiments, epitaxial source/drain features are formed by etching portions of active regions 312, 314, 316 and 318 on opposite sides of gate structures 322, 324, 326 and 328 to form recesses (not shown) and then filling the recesses with one or more semiconductor materials. In some embodiments, the recesses are etched, for example, using a dry etch such as, for example, RIE or a wet etch. For example, if substrate 302 is a silicon substrate, the recessing is carried out by using a directional etching solution including ammonia and/or tetramethyl ammonium hydroxide (TMAH). In some embodiments, epitaxial source/drain features are formed in the recesses by a selective epitaxial growth process such as, for example, CVD, molecular beam epitaxy, and/or other suitable processes. In some embodiments, the epitaxial growth continues until top surfaces of source/drain features 420 are coplanar with the top surface of substrate 302. In some embodiments, the epitaxial growth continues until top surfaces of epitaxial source/drain features are above the top surface of substrate 302. In some embodiments, the step of recessing active regions 312, 314, 316 and 318 is omitted and epitaxial source/drain features are formed directly on surfaces of active regions 312, 314, 316 and 318. Epitaxial source/drain features also include dopants of appropriate conductivity types for either PMOS or NMOS transistors. In some embodiments, epitaxial source/drain features are in-situ doped during epitaxial growth processes. In some embodiments, epitaxial source/drain features are doped (ex-situ) after epitaxial growth utilizing, for example, ion implantation, gas phase doping or dopant out-diffusion from a sacrificial dopant source material. After formation of source/drain features 420 and/or after the subsequent doping processes, one or more annealing processes are performed to active dopants in source/drain features 420. In some embodiments, the annealing processes include rapid thermal annealing (RTA) and/or laser annealing processes.

In some embodiments, silicide layers 422 are formed on top of source/drain features 420 to reduce resistance of source/drain features 420. In some embodiments and when gate electrode 414 includes doped polysilicon, a silicide layer (not shown) is also formed on top of gate electrode 414 of respective gate structures 322, 324, 326, 328. In some embodiments, silicide layers 422 are formed by first depositing a metal layer (not shown) over source/drain features 420 and gate structures 322, 24, 326 and 328. In some embodiments, the metal layer includes nickel, cobalt, titanium, platinum, or other suitable metal materials. In some embodiments, the metal layer is deposited using CVD, PVD, ALD, or other suitable deposition processes. Following deposition of the meal layer, an annealing process is performed. The annealing process causes metal atoms in the metal layer to react silicon atoms in source/drain features 420 and silicon atoms in gate electrode 414 in some embodiments to create silicide layers 422. Subsequently, the unreacted portion of the metal layer is removed. In some embodiments, the unreacted metal layer portion is removed using a wet etch or a dry etch such as RIE or plasmas etch.

Transistors for SRAM cell 400 are thus formed. The first pull-up transistor PU-1 includes a first portion of a gate structure 322 over a portion of active region 314 and source/drain features 420 which are p-doped regions of active region 314 on opposite sides of the first portion of gate structure 322. The second pull-up transistor PU-2 includes a first portion of gate structure 324 over a portion of active region 316 and source/drain features 420 which are p-doped regions of active region 316 on opposite sides of the first portion of gate structure 324.

The first pull-down transistor PD-1 includes a second portion of gate structure 322 over a first portion of active region 312 and source/drain features 420 which are n-doped regions of active region 312 on opposite sides of the second portion of gate structure 322. The second pull-down transistor PD-2 includes a second portion of gate structure 324 over a first portion of active region 318 and source/drain features 420 which are n-doped regions of active region 318 on opposite sides of the second portion of gate structure 324. The first pull-down transistors PD-1 and the first pull-up transistor PU-1 thus share a common gate structure (i.e., gate structure 322), while the second pull-down transistors PD-2 and the second pull-up transistor PU-2 share a common gate structure (i.e., gate structure 324).

The first pass-gate transistor PG-1 includes a gate structure 326 over a second portion of active region 312 and source/drain features 420 which are n-doped regions of active region 312 on opposite sides of gate structure 326. In some embodiments, the first pass-gate transistor PG-1 and the first pull-down transistor PD-1 share a common source/drain feature 420 located between gate structures 322 and 326. The second pass-gate transistor PG-2 includes a gate structure 328 over a second portion of active region 318 and source/drain features 420 which are n-doped regions of active region 318 on opposite sides of gate structure 328. In some embodiments, the second pass-gate transistor PG-2 and the second pull-down PD-2 share a common source/drain feature 420 located between gate structures 324 and 324.

Figure 5A:
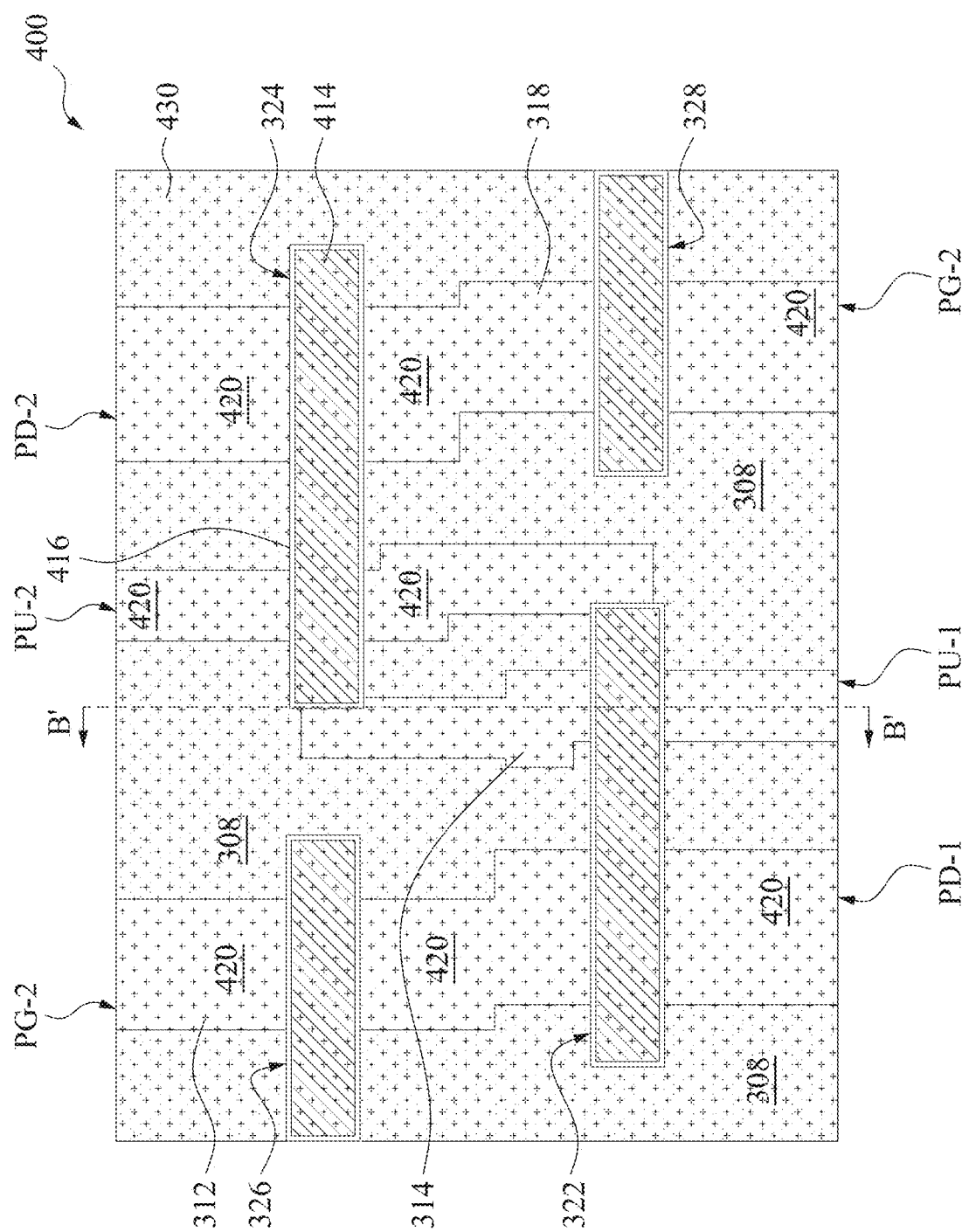
FIG. 5A is a top view of a semiconductor structure following formation of a contact level dielectric layer, in accordance with some embodiments.
Figure 5B:
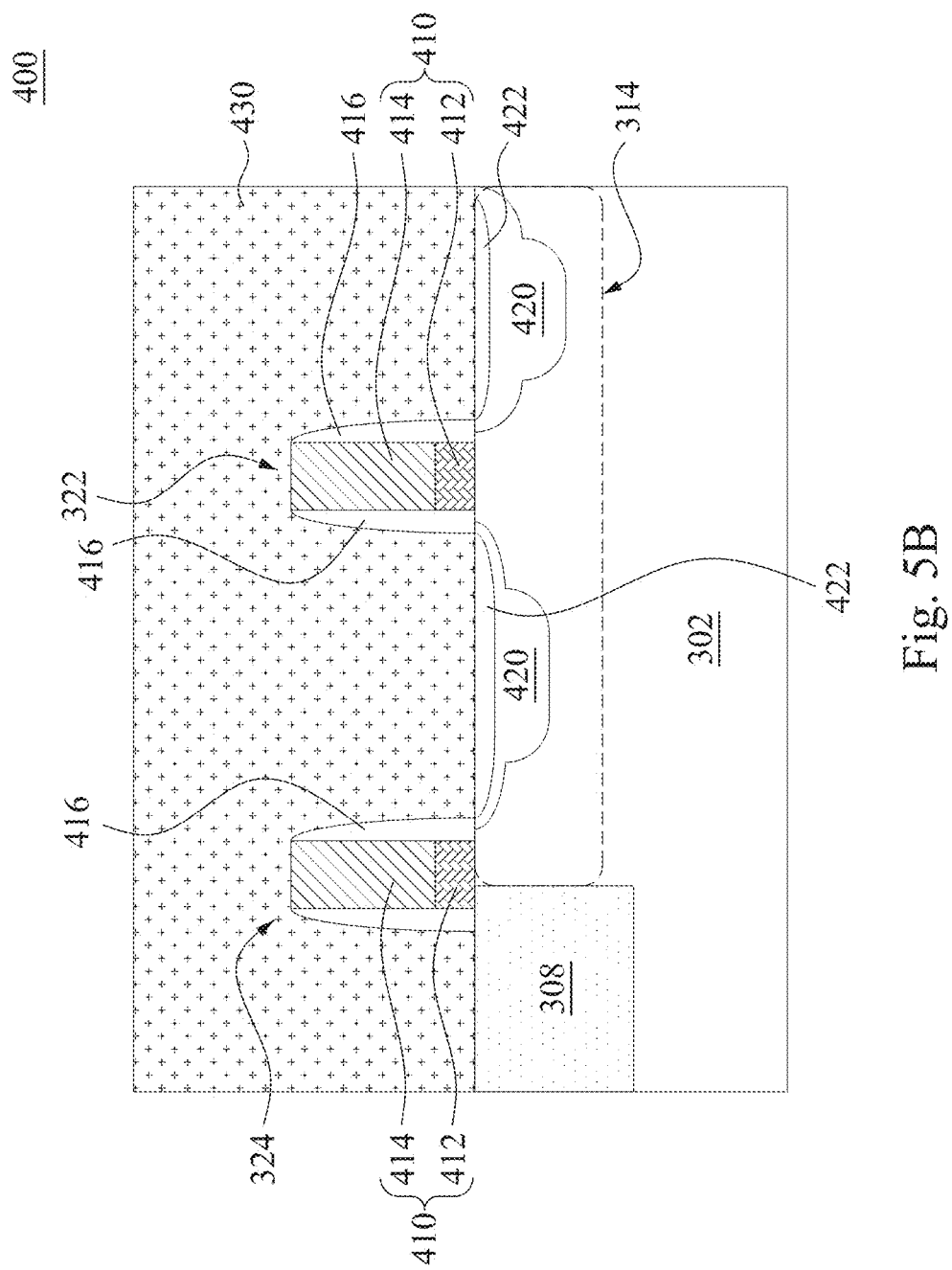
FIG. 5B is a cross-sectional view of the semiconductor structure of FIG. 5A taken along line B-B'.

FIG. 5A is a top view of a semiconductor structure following forming of a contact level dielectric layer 430, in accordance with some embodiments. FIG. 5B is a cross-sectional view of the semiconductor structure of FIG. 5A taken along line B-B'.

Referring to FIGS. 5A and 5B, contact level dielectric layer 430 is deposited over substrate 302. Contact level dielectric layer 430 fills in gaps between gate structures 322, 324, 326 and 328. In some embodiments, contact level dielectric layer 430 includes a silicon dioxide, silicon nitride, silicon oxynitride or a low dielectric constant (low-k) material having a dielectric constant less than silicon dioxide. In some embodiments, contact level dielectric layer 430 includes spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, parylene, BCB (bis-benzocyclobutenes), SiLK (Dow Chemical, Midland, Mich.), polyimide, and/or other suitable materials. In some embodiments, contact level dielectric layer 430 has a multi-layer structure including more than one layer, each formed of a dielectric material mentioned above. In some embodiments, contact level dielectric layer 430 is formed by CVD, PE-CVD, PVD, ALD, spin coating, other suitable deposition process(es), or combinations thereof. In some embodiments, a CMP process is performed to planarize a top surface of contact level dielectric layer 430. The planarized top surface of contact level dielectric layer 430 is located above topmost surfaces (i.e., top surfaces of gate electrodes 414) of gate structures 322, 324, 326, 328.

Figure 6A:
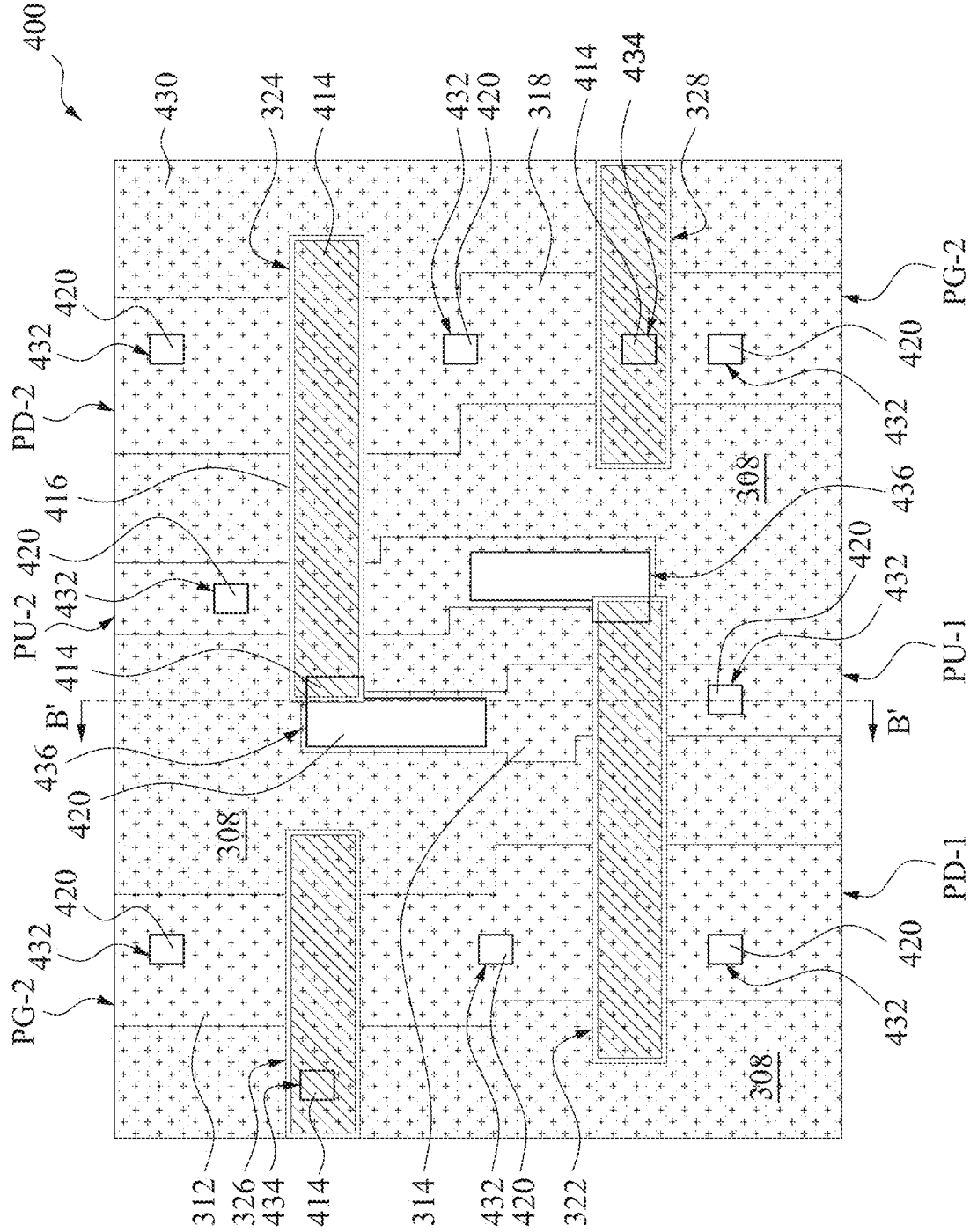
FIG. 6A is a top view of a semiconductor structure following definition of various contact openings within the contact level dielectric layer, in accordance with some embodiments.
Figure 6B:
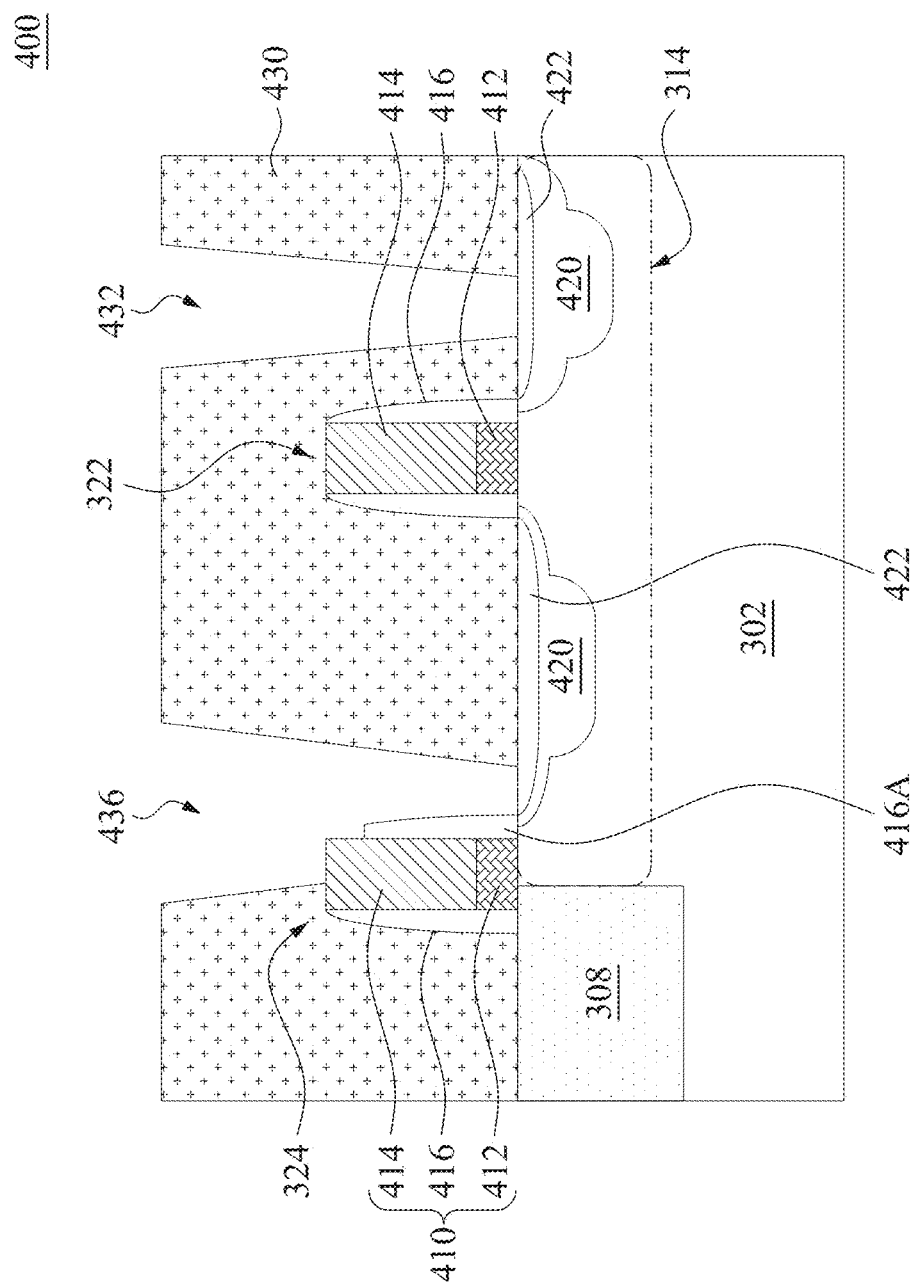
FIG. 6B is a cross-sectional view of the semiconductor structure of FIG. 6A taken along line B-B'.

FIG. 6A is a top view of a semiconductor structure following defining of various contact openings 432, 434, 436 within contact level dielectric layer 430, in accordance with some embodiments. FIG. 6B is a cross-sectional view of the semiconductor structure of FIG. 6A taken along line B-B'.

Referring to FIGS. 6A and 6B, active area contact openings 432 are formed extending through contact level dielectric layer 430, each of which expose a portion of a source/drain feature 420 in a corresponding active region 312, 314, 316, 318. Gate contact openings 434 are formed extending through contact level dielectric layer 430, each of which exposes a portion of a gate electrode 414 of a corresponding gate structure 326, 328. Butted contact openings 436 are formed extending through contact level dielectric layer 430, each of which exposes a portion of a source/drain feature 420 of one of pull-up transistors PU-1, PU-2 and a portion of gate electrode 414 of a neighboring gate structure (e.g., gate structure 322 or 324).

In some embodiments, various contact openings 432, 434, 436 are formed using lithographic etching processes. In some embodiments, forming contact openings 432, 434 and 436 includes using one or more etching processes such as a wet etch, a dry etch such as RIE or plasma etch, or a combination thereof. In some embodiments, forming contact openings 432, 434 and 436 includes using one or more etchant materials. In some embodiments, forming contact openings 432, 434 and 436 includes using one or more of $Cl_2$, $SF_6$, HBr, HCl, $CF_4$, $CHF_3$, $C_2F_6$, $C_4F_8$, or other similar etchant materials. In some embodiments, a mask layer (not shown) is first deposited over contact level dielectric layer 430 and lithographically patterned to form openings therein. The openings exposes portions of contact level dielectric layer 430 wherein contact openings 432, 434, 436 are to be formed. In some embodiments, the mask layer is a photoresist layer or a photoresist layer in conjunction with hardmask layer(s). The pattern in the mask layer is transferred through contact level dielectric layer 430 to define contact openings 432, 434 and 436 therein. The patterned mask layer is subsequently removed, for example, using oxygen-based plasma etching.

In some embodiments, a first part of each butted contact opening 436 that exposes a portion of a source/drain feature 420 of one of pull-up transistors PU-1, PU-2 and a second portion of each butted contact opening 436 that exposes a portion of gate electrode 414 of a neighboring gate structure (e.g., gate structure 322 or 324) are formed at the same time by a single lithographic etching process. In some embodiments, a first part of each butted contact opening 436 that exposes a portion of a source/drain feature 420 of one of pull-up transistors PU-1, PU-2 and a second portion of each butted contact opening 436 that exposes a portion of gate electrode 414 of a neighboring gate structure (e.g., gate structure 322 or 324) are formed separately by a two-step lithographic etching process.

In some embodiments, the etching process that is used to form butted contact openings 436 also recesses portions of gate spacers 416 that are exposed by butted contact openings 436 (herein referred to as gate spacers 416A). Thus, following the etching process, gate spacers 416A that are exposed by butted contact openings 436 have a height lower than portions of gate spacers 416 remaining covered by contact level dielectric layer 430.

Figure 7A:
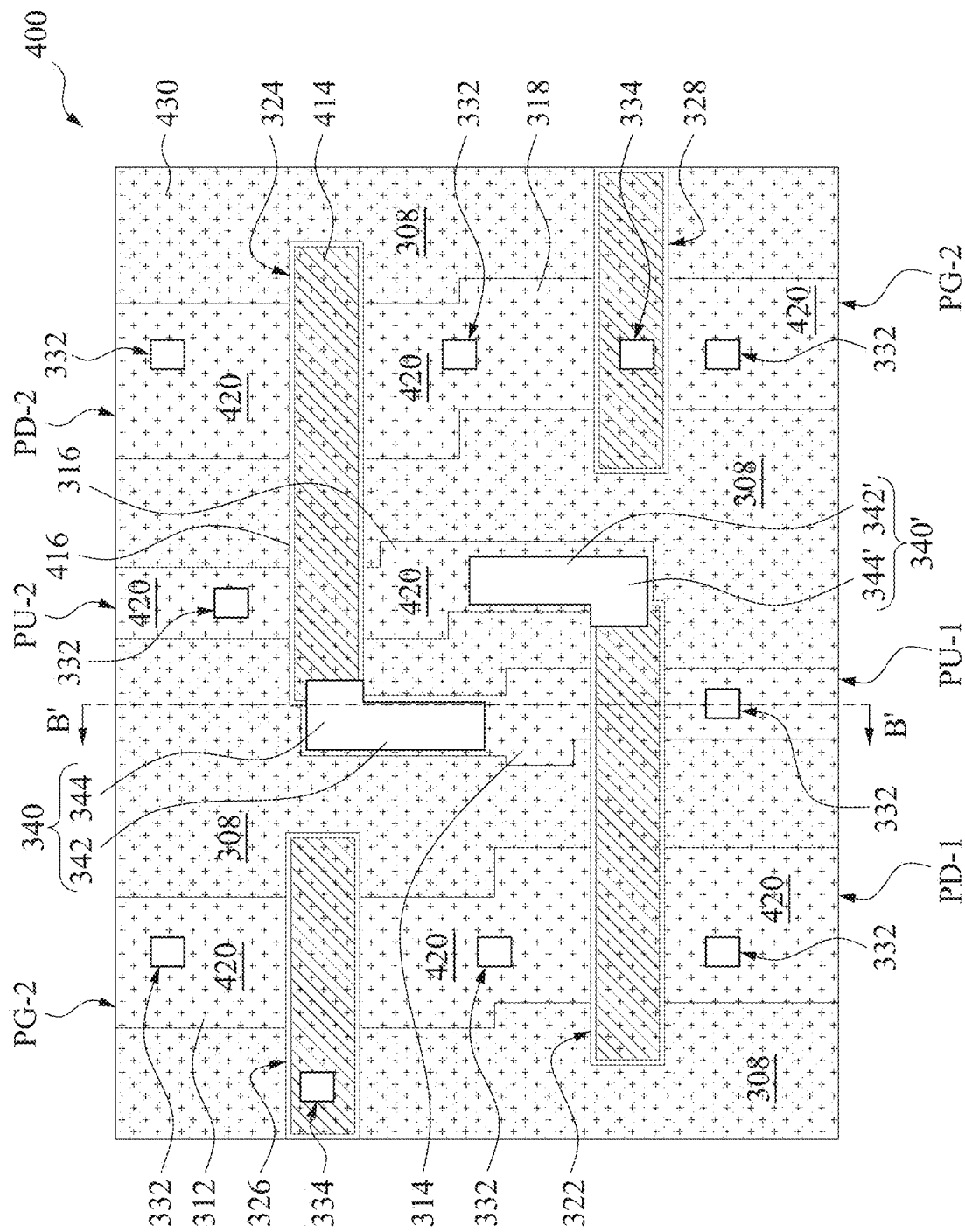
FIG. 7A is a top view of a semiconductor structure following formation of contacts, in accordance with some embodiments.
Figure 7B:
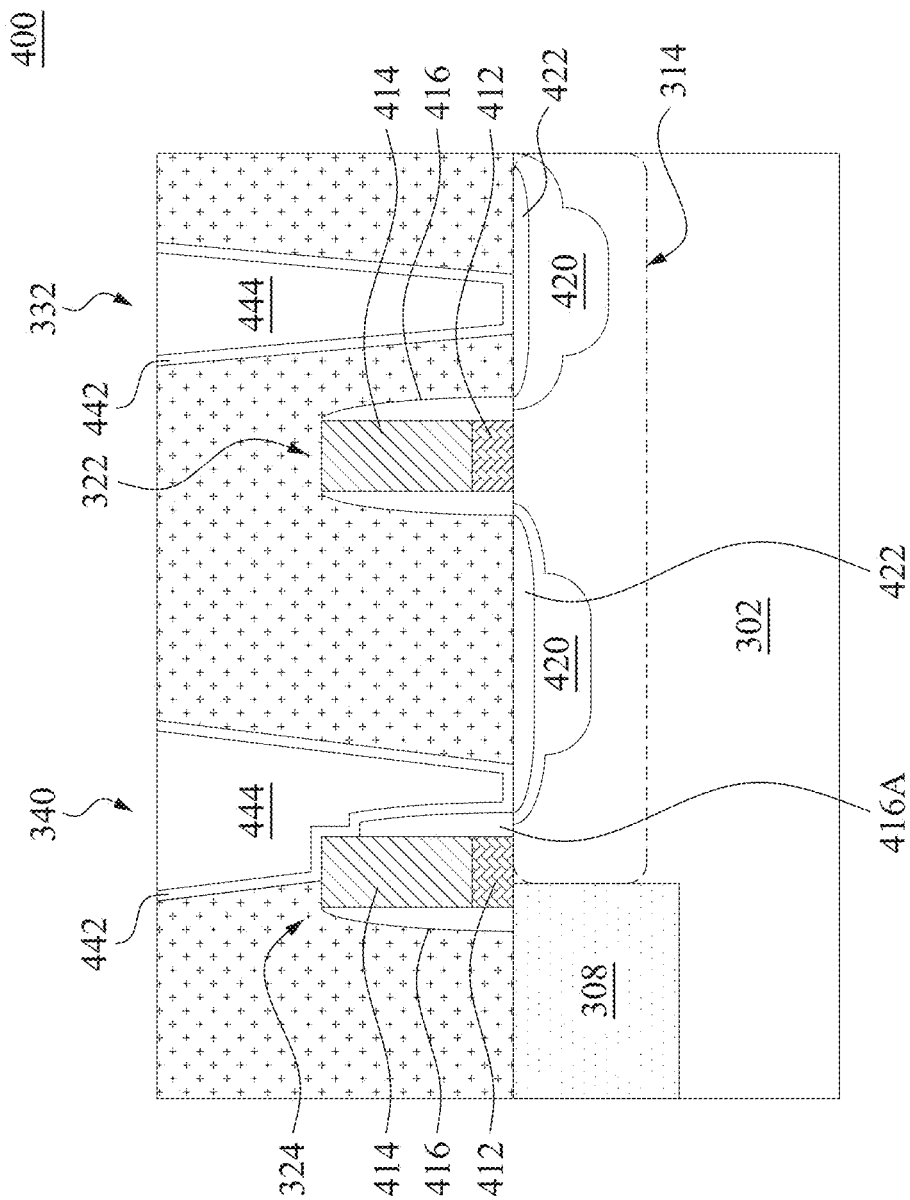
FIG. 7B is a cross-sectional view of the semiconductor structure of FIG. 7A taken along line B-B'.

FIG. 7A is a top view of a semiconductor structure following forming of various contacts including active area contacts 332, gate contacts 334 and butted contacts 340, 340', in accordance with some embodiments. FIG. 7B is a cross-sectional view of the semiconductor structure of FIG. 7A taken along line B-B'.

Referring to FIGS. 7A and 7B, active area contacts 332 (i.e., source/drain contacts) are formed in active area contact openings 432 to provide electrical connection to respective source/drain features 420 for transistors PU-1, PU-2, PD-1, PD-2, PG-1 and PG-2. Gate contacts 334 are formed in gate contact openings 434 to provide electrical connection to receptive gate structures 326, 328 of pass-gate transistors PG-1, PG-2. Butted contacts 340, 340' are formed in butted contact openings 436 to provide electrical coupling between a first inverter including first pull-up and pull-down transistors PU-1 and PD-1, and a second inverter including second pull-up and pull-down transistors PU-2 and PD-2. In some embodiments, the etching process employed to form butted contact openings 436 also removes portions of gate spacers 416. Thus, gate spacer 416A contacting butted contact 340, 340' has a height less than a height of gate spacers 416 not contacting butted contact 340, 340'.

Each of active area contacts 332, gate contacts 334 and butted contacts 340 includes a contact liner 442 and a contact plug 444 surrounded by contact liner 442. In some embodiments, contact liner 442 includes Ti, Ta, TiN, TaN, or combinations thereof. In some embodiments, contact plug 444 includes a conductive material such as, for example, tungsten, aluminum, copper, or alloys thereof.

In some embodiments, various contacts 332, 334, 340 and 340' are formed by first depositing a contact liner layer (not shown) along sidewall and bottom surfaces of contact openings 432, 434 and 436 and a top surface of contact level dielectric layer 430. In some embodiments, the contact liner layer is deposited using a conformal deposition process such as CVD or ALD. A conductive contact material layer (not shown) is subsequently deposited on the contact liner layer to fill in contact openings 432, 434 and 436. In some embodiments, the conductive contact material layer is deposited using CVD, PVD, plating, or other suitable deposition processes. Portions of the conducive contact material layer and the contact liner layer that are located above the top surface of contact level dielectric layer 430 are removed using a planarization process such as, for example, CMP. A remaining portion of the contact liner layer within each of contact openings 432, 434 and 436 constitutes a contact liner 442, while a remaining portion of the conductive contact material layer within each of contact openings 432, 434 and 436 constitutes a contact plug 444.

Figure 8:
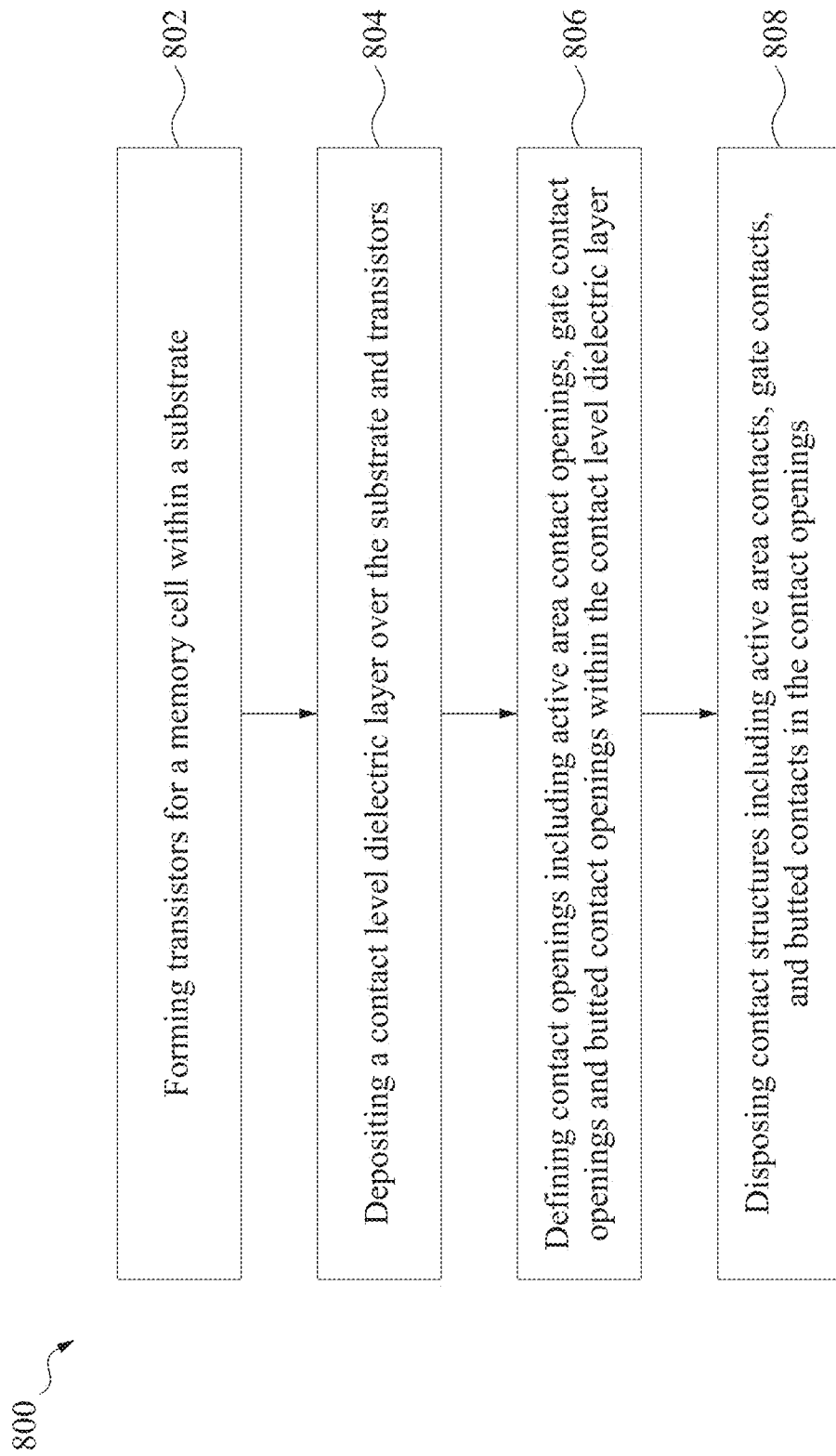
FIG. 8 is a flowchart of a method of making an SRAM cell, in accordance with some embodiments.

FIG. 8 is a flowchart of a method 800 of making an SRAM cell, in accordance with some embodiments. In operation 802, transistors for a memory cell are formed in a suitable substrate. In operation 804, a contact level dielectric layer is deposited on the substrate and transistors. In operation 806, various contact openings including active area contact openings, gate contact openings and butted contact openings are defined within the contact level dielectric layer. In operation 808, various contact structures including active area contacts, gate contacts, and butted contacts are disposed in the active contact openings, gate contact openings, and butted contact openings, respectively.

An aspect of this description relates to a semiconductor structure. The semiconductor structure includes a first transistor comprising a first gate structure over a first active region in a substrate. The semiconductor structure further includes a second active region in the substrate. The semiconductor structure further includes a first butted contact. The butted contact includes a first portion extending in a first direction and overlapping the second active region, and a second portion extending from the first portion in a second direction, different from the first direction, wherein the second portion directly contacts the first gate structure. In some embodiments, the semiconductor structure further includes a second transistor, wherein the second transistor includes a second gate structure over the second active region. In some embodiments, the semiconductor structure further includes a second butted contact electrically connecting the second gate structure to the first active region. In some embodiments, the second butted contact directly contacts the second gate structure. In some embodiments, the second butted contact includes a third portion extending in the first direction and overlapping the first active region; and a fourth portion extending from the third portion in a third direction, different from the first direction, wherein the fourth portion overlaps the second gate structure. In some embodiments, the third direction is parallel to the second direction. In some embodiments, the semiconductor structure further includes a contact electrically connected to the second active area on an opposite side of the second gate structure from the first butted contact. In some embodiments, a width of the first butted contact increases as a distance from the substrate increases. In some embodiments, the semiconductor structure further includes an isolation region in the substrate, wherein the first gate structure at least partially overlaps the isolation region.

An aspect of this description relates to a method of manufacturing a semiconductor device. The method includes forming a first gate structure over a first active region in a substrate. The method further includes depositing a dielectric layer over the first gate structure. The method further includes etching the dielectric layer to define an opening, wherein the opening exposes a second active region in the substrate, and the opening further exposes a portion of the first gate structure. The method further includes depositing a conductive material in the opening to electrically connect the first gate structure to the second active region, wherein filling the opening comprises directly contacting the first gate structure with the conductive material. In some embodiments, etching the dielectric layer further includes removing a portion of a sidewall spacer from the first gate structure. In some embodiments, removing the portion of the sidewall spacer includes exposes a sidewall of a gate electrode of the first gate structure, and depositing the conductive material comprises depositing the conductive material along the exposed sidewall of the gate electrode. In some embodiments, the method further includes forming a source/drain feature in the second active region, wherein etching the dielectric layer comprises exposing the source/drain feature. In some embodiments, forming the first gate structure includes forming the gate structure at least partially overlapping an isolation structure.

An aspect of this description relates to a method of using a semiconductor device. The method includes supplying a voltage to a first source/drain (S/D) region of a first transistor, wherein the first transistor is over a first active region in a substrate, and the first transistor comprises a first gate structure. The method further includes selectively electrically transferring the voltage from the first S/D region to a second S/D region on an opposite side of the first gate structure from the first S/D region. The method further includes electrically connecting the voltage to a second gate structure using a butted contact directly connected to the second S/D region and to the second gate structure, wherein the second gate structure is over a second active region. In some embodiments, electrically connecting the voltage to the second gate structure includes electrically connecting the voltage to the second gate structure using an L-shaped butted contact. In some embodiments, supplying the voltage includes supplying a power supply voltage. In some embodiments, supplying the voltage includes supplying a ground voltage. In some embodiments, electrically connecting the voltage to the second gate structure includes making a channel of a second transistor including the second gate structure conductive. In some embodiments, electrically connecting the voltage to the second gate structure includes making a channel of a second transistor including the second gate structure non-conductive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a first transistor comprising a first gate structure over a first active region in a substrate;
 a second active region in the substrate; and
 a first butted contact, wherein the butted contact comprises:
  a first portion extending in a first direction and overlapping the second active region, and
  a second portion extending from the first portion in a second direction, different from the first direction, wherein the second portion directly contacts a top surface and a sidewall of the first gate structure.

2. The semiconductor structure of claim 1, further comprising a second transistor, wherein the second transistor comprises a second gate structure over the second active region.

3. The semiconductor structure of claim 2, further comprising a second butted contact electrically connecting the second gate structure to the first active region.

4. The semiconductor structure of claim 3, wherein the second butted contact directly contacts the second gate structure.

5. The semiconductor structure of claim 3, wherein the second butted contact comprises:
 a third portion extending in the first direction and overlapping the first active region; and
 a fourth portion extending from the third portion in a third direction, different from the first direction, wherein the fourth portion overlaps the second gate structure.

6. The semiconductor structure of claim 5, wherein the third direction is parallel to the second direction.

7. The semiconductor structure of claim 2, further comprising a contact electrically connected to the second active region on an opposite side of the second gate structure from the first butted contact.

8. The semiconductor structure of claim 1, wherein a width of the first butted contact increases as a distance from the substrate increases.

9. The semiconductor structure of claim 1, further comprising an isolation region in the substrate, wherein the first gate structure at least partially overlaps the isolation region.

10. A method of manufacturing a semiconductor device, the method comprising:
 forming a first gate electrode over a first active region in a substrate;
 depositing a dielectric layer over the first gate electrode;
 etching the dielectric layer to define an opening, wherein the opening exposes a second active region in the substrate and separated from the first active region in a direction parallel to a top surface of the substrate, and the opening further exposes a portion of the first gate electrode; and
 depositing a conductive material in the opening to electrically connect the first gate electrode to the second active region, wherein filling the opening comprises directly contacting the first gate electrode with the conductive material.

11. The method of claim 10, wherein etching the dielectric layer further comprises removing a portion of a sidewall spacer from the first gate electrode.

12. The method of claim 11, wherein removing the portion of the sidewall spacer comprises exposing a sidewall of the first gate electrode, and depositing the conductive material comprises depositing the conductive material along the exposed sidewall of the first gate electrode.

13. The method of claim 10, further comprising forming a source/drain feature in the second active region, wherein etching the dielectric layer comprises exposing the source/drain feature.

14. The method of claim 10, wherein forming the first gate electrode comprises forming the gate electrode at least partially overlapping an isolation structure.

15. A method of using a semiconductor device, the method comprising:
 supplying a voltage to a first source/drain (S/D) region of a first transistor, wherein the first transistor is over a first active region in a substrate, and the first transistor comprises a first gate structure;
 selectively electrically transferring the voltage from the first S/D region to a second S/D region on an opposite side of the first gate structure from the first S/D region; and
 electrically connecting the voltage to a second gate structure using a butted contact directly connected to the second S/D region and to the second gate structure, wherein the second gate structure extends in a first direction, and the butted contact extends beyond the second gate structure in the first direction.

16. The method of claim 15, wherein electrically connecting the voltage to the second gate structure comprises electrically connecting the voltage to the second gate structure using an L-shaped butted contact.

17. The method of claim 15, wherein supplying the voltage comprises supplying a power supply voltage.

18. The method of claim 15, wherein supplying the voltage comprises supplying a ground voltage.

19. The method of claim 15, wherein electrically connecting the voltage to the second gate structure comprises making a channel of a second transistor including the second gate structure conductive.

20. The method of claim 15, wherein electrically connecting the voltage to the second gate structure comprises making a channel of a second transistor including the second gate structure non-conductive.

* * * * *